US010455178B2

(12) United States Patent
Feick

(10) Patent No.: US 10,455,178 B2
(45) Date of Patent: Oct. 22, 2019

(54) OPTICAL SENSOR DEVICE AND METHOD FOR OPERATING A TIME-OF-FLIGHT SENSOR

(71) Applicant: Infineon Technologies AG, Neubiberg (DE)

(72) Inventor: Henning Feick, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/472,340

(22) Filed: Mar. 29, 2017

(65) Prior Publication Data

US 2017/0332029 A1 Nov. 16, 2017

(30) Foreign Application Priority Data

May 13, 2016 (DE) .................. 10 2016 208 347

(51) Int. Cl.
*H04N 5/374* (2011.01)
*H04N 5/378* (2011.01)
*G01S 17/00* (2006.01)
*H04N 5/3745* (2011.01)

(52) U.S. Cl.
CPC .......... *H04N 5/3742* (2013.01); *G01S 17/00* (2013.01); *H04N 5/378* (2013.01); *H04N 5/3745* (2013.01); *H04N 5/37457* (2013.01)

(58) Field of Classification Search
CPC .... H04N 5/3742; H04N 5/3745; H04N 5/378; H04N 5/37457; G01S 17/00
See application file for complete search history.

(56) References Cited

U.S. PATENT DOCUMENTS

| 2012/0175685 | A1* | 7/2012 | Kim ................. H01L 27/14603 257/225 |
| 2012/0248514 | A1* | 10/2012 | Korekado ............ H04N 5/3597 257/292 |
| 2013/0020463 | A1* | 1/2013 | Lee ........................ H04N 5/378 250/206 |
| 2013/0021441 | A1* | 1/2013 | Kim ..................... H04N 5/3745 348/46 |
| 2014/0071180 | A1* | 3/2014 | Shin ........................ G09G 5/10 345/690 |
| 2014/0104397 | A1* | 4/2014 | Shin ....................... H04N 5/378 348/49 |
| 2014/0252437 | A1* | 9/2014 | Oh .................... H01L 27/14643 257/292 |
| 2017/0332024 | A1* | 11/2017 | Feick ..................... H04N 5/378 |
| 2018/0156898 | A1* | 6/2018 | Suzuki .................. H04N 5/353 |
| 2018/0156899 | A1* | 6/2018 | Yamada ................. H04N 5/353 |
| 2018/0219035 | A1* | 8/2018 | Otsuki .................. H04N 5/369 |
| 2018/0226439 | A1* | 8/2018 | Oda ....................... H04N 5/374 |

* cited by examiner

*Primary Examiner* — Jason A Flohre
(74) *Attorney, Agent, or Firm* — Harrity & Harrity, LLP

(57) ABSTRACT

An optical sensor device, which may be a time-of-flight sensor, comprises a pixel array having a plurality of pixels. Moreover, the optical sensor device comprises a read-out node configured to provide photo-generated charge carriers from a first pixel and a second pixel for read-out and a first transfer gate configured to enable a read-out of the first pixel using the read-out node and a second transfer gate to disable a read-out of the second pixel during read-out of the first pixel.

20 Claims, 7 Drawing Sheets

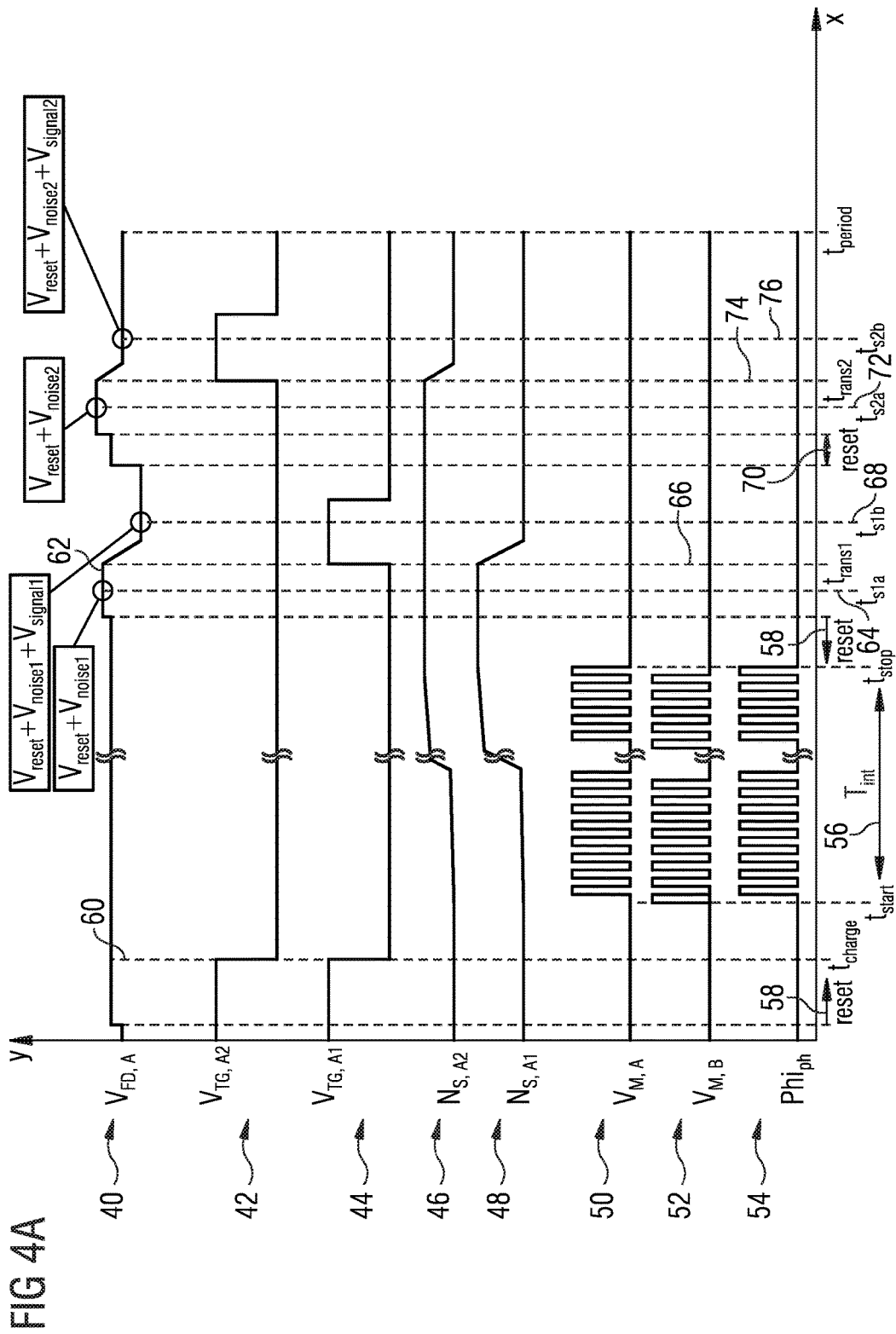

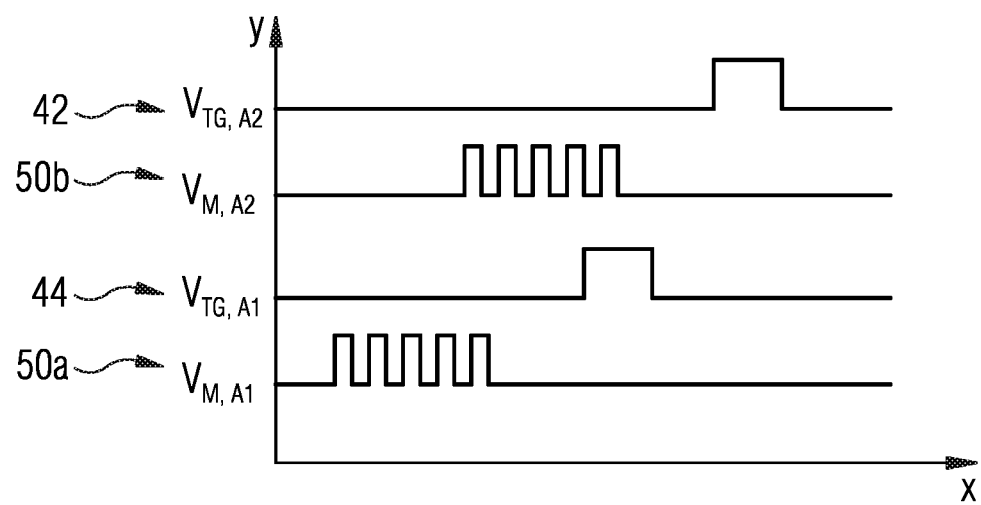

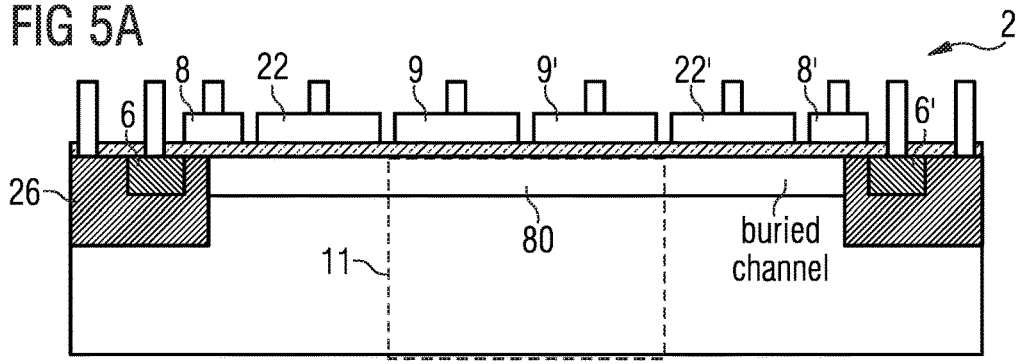
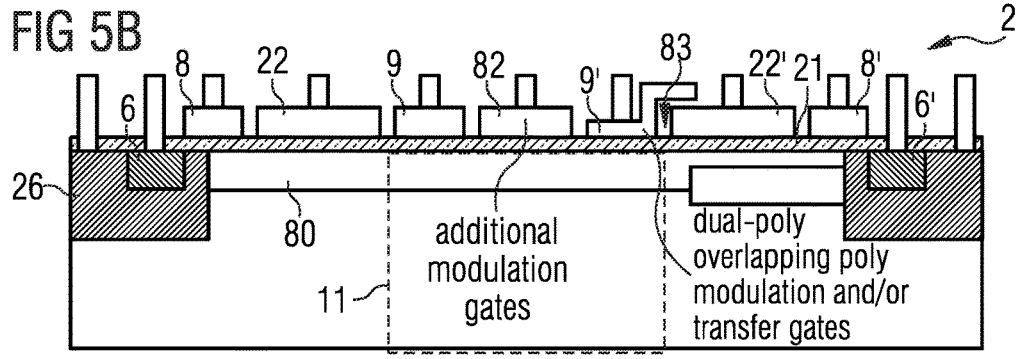
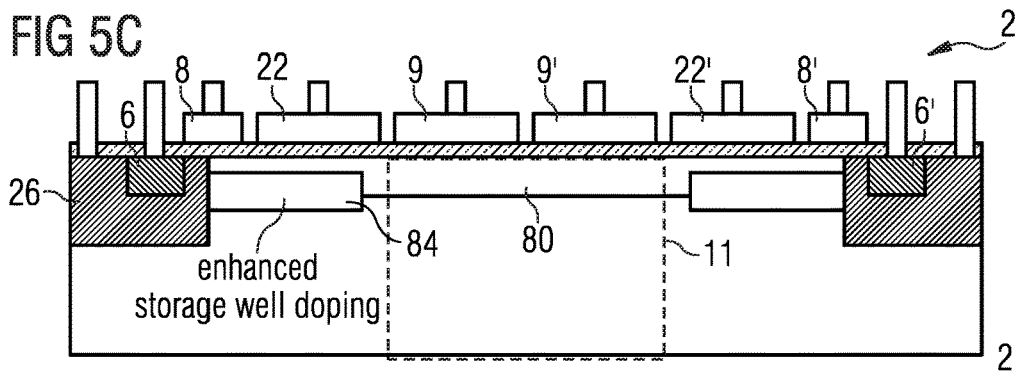
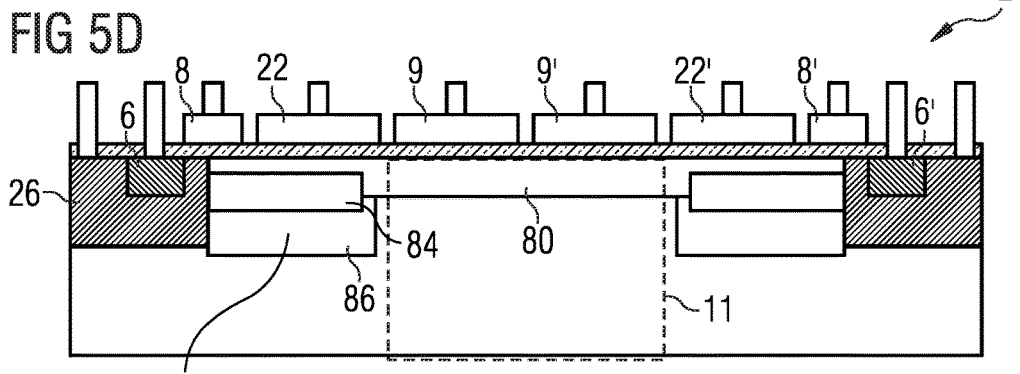

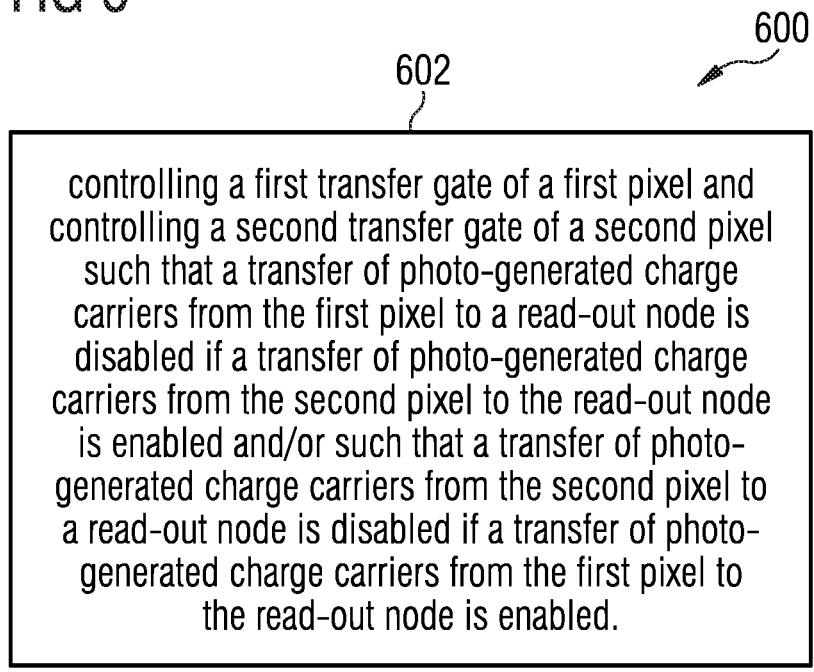

OPTICAL SENSOR DEVICE AND METHOD FOR OPERATING A TIME-OF-FLIGHT SENSOR

RELATED APPLICATION

This application claims priority under 35 U.S.C. § 119 to German Patent Application No. 102016208347.3, filed on May 13, 2016, the content of which is incorporated by reference herein in its entirety.

TECHNICAL FIELD

This disclosure relates, in general, to the field of integrated circuits, more specifically to the field of optical sensors employing photogate structures for redirection of photo-generated charge carriers and an arrangement of the photogate structures. Further embodiments show a transfer gate photo-mixing device.

BACKGROUND

Optical sensors and specifically time-of-flight optical sensors for depth imaging suffer from a comparably high (i.e. poor) signal-to-noise ratio for electrical signals representing the time-of-flight which is the time needed for an electromagnetic signal such as e.g. light to travel from an active illumination source to an object and then back, or further on, to the optical sensor. The signal may be formed by amplitude modulation of the illumination source and the image relation in the optical sensor. Depending on the phase relation to the illumination source, only a fraction of the photo-generated charge carriers is directed towards a charge integration node which is read out after a certain integration time. As this charge is small, it is difficult to obtain a large signal voltage with respect to the noise source from the electronic read-out circuit.

Thus, the current design of time-of-flight sensors reveal essential limitations in the signal quality and, therefore, the precision of the time-of-flight measurement.

SUMMARY

Therefore, there is a need for an improved concept to form time-of-flight sensors with an improved signal quality.

An optical sensor device, which may be a time-of-flight sensor, comprises a pixel array having a plurality of pixels. Moreover, the optical sensor device comprises a read-out node configured to provide photo-generated charge carriers from a first and a second pixel for read-out and a first transfer gate configured to enable a read-out of the first pixel using the read-out node and a second transfer gate to disable a read-out of the second pixel during read-out of the first pixel.

The transfer gate may be integrated into the optical sensor structure separating the floating diode (or read-out node) from the (charge) storage region under the separation gate. Therefore, the transfer gate may shift or reduce a potential barrier between the read-out node and the storage region during read-out of the charge carriers and to allow the potential barrier between the read-out node and the storage region to disable charge carriers to be transferred from the storage region to the read-out node during sensing mode or, more generally, if the read-out of the charge carriers is disabled at a current pixel. Since the transfer gate may be controlled in such a way that it implements a global shutter action, it may replace a hold switch in a read-out circuit typically used to separate the actual evaluation or analysis part of the read-out circuit processing charge carriers of a previous measurement from the charge carriers generated at the current measurement. In further embodiments, the transfer gate may provide the opportunity to separate photo-generated charge carriers from the read-out node and therefore from the read-out circuit, such that the read-out node (and the read-out circuit) can be executed while collection of carriers is taking place in the storage region of the pixel.

Furthermore, more (or a greater) area of a semiconductor substrate is saved if a common read-out node is connected to two (or more) pixels of the time-of-flight sensor to perform a consecutive read-out of the charge carriers from both pixels. The transfer gate of each pixel is located between the (common) read-out node and the storage region of each pixel. Therefore, compared to having one read-out node for each pixel of the sensor, the area of one read-out node is saved if two adjacent pixels are connected to a common read-out node.

According to further embodiments, the optical sensor device comprises a pixel array having at least three pixels. Therefore, the read-out node is configured to provide photo-generated charge carriers from the at least three pixels for read-out. A further read-out node is configured to provide further photo-generated charge carriers from the at least three pixels for read-out, wherein the further photo-generated charge carriers are different from the photo-generated charge carriers. More specifically, the further photo-generated charge carriers may be generated by demodulation of the inbound electromagnetic signal at a phase different from the phase used for demodulating the electromagnetic signal generating the photo-generated charge carriers. In other words, the photo-generated charge carriers and the further photo-generated charge carriers are generated (e.g. by the inner photoelectric effect) using the inbound electromagnetic signal (such as e.g. light) having a first phase and a second phase, respectively. Moreover, each pixel of the at least three pixels comprises a transfer gate configured to provide the photo-generated charge carriers from a storage region of each of the pixels to the read-out node and therefore to the read-out circuit if a read-out circuit is connected to the read-out node.

Furthermore, according to the embodiment, each pixel of the at least three pixels may comprise a further transfer gate configured to provide the further photo-generated charge carriers from a further storage region of each of the (at least three) pixels to the further read-out node. The storage region may store the photo-generated charge carriers derived from an electromagnetic signal having the first phase and the further storage region may store the further photo-generated charge carriers derived from an electro-magnetic signal having the second phase. Moreover, the controller may control the transfer gates of the at least three pixels connected to the read-out node such that, in case one of the pixels connected to the read-out node is in a read-out mode, the remaining pixels connected to the read-out node are in a sensing mode to perform a successive read-out of the pixels connected to the read-out node. This approach may be referred to as a two-tap pixel since the same inbound electromagnetic signal is demodulated for (two) different phase shifts such that information from the two different phases may be obtained during one measurement. Therefore, two separate read-out nodes are connected to a single two-tap pixel such that, if a second pixel is connected to the same read-out nodes, area of two read-out nodes is saved when compared to each pixel having their own read-out nodes.

According to further embodiments, a method for operating a time-of-flight sensor comprising controlling a first transfer gate of a first pixel and controlling a second transfer gate of a second pixel such that a transfer of photo-generated charge carriers from the first pixel to a read-out node is disabled if a transfer of photo-generated charge carriers from the second pixel to the read-out node is enabled. Additionally or alternatively, a transfer of photo-generated charge carriers from the second pixel to the read-out node is disabled if a transfer of photo-generated charge carriers from the first pixel to the read-out node is enabled.

BRIEF DESCRIPTION OF THE DRAWINGS

Embodiments of the disclosure will be discussed subsequently referring to the enclosed drawings, wherein:

FIGS. 4A and 4B show a schematic timing diagram of an exemplary read-out of two pixels connected to a single read-out node;

FIGS. 5A-5D show a schematic cross-sectional views of the optical sensor device according to embodiments; and FIG. 6 shows a schematic flow chart of a method for operating a time-of-flight sensor.

DETAILED DESCRIPTION

In the following, embodiments of the disclosure will be described in further detail. Elements shown in the respective figures having the same or a similar functionality will have associated therewith the same reference signs. Furthermore, the same reference sign appended by single letters (a, b, c, d) may refer to the same element in another pixel wherein the same reference sign appended by an apostrophe (') may refer to the same element in the same pixel, however associated to different photo-generated charge carriers.

Figure 1:
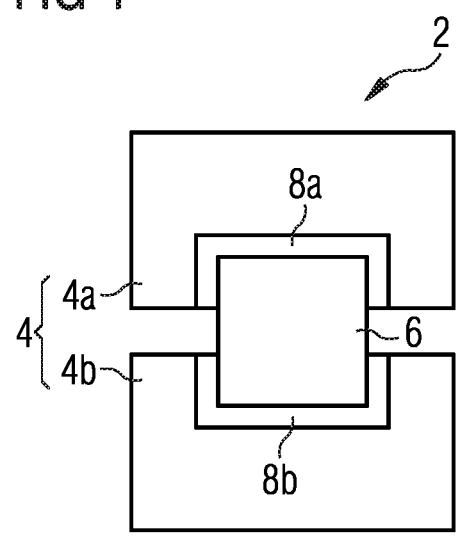
FIG. 1 shows a schematic top view of an optical sensor device.

FIG. 1 shows a schematic top view of an optical sensor device 2. The optical sensor device 2 may be a time-of-flight sensor. The sensor 2 comprises a pixel array 4, a read-out node 6, a first transfer gate 8a, and a second transfer gate 8b. The pixel array 4 has a plurality of pixels 4a, 4b. The read-out node may be located at least between two pixels of the plurality of pixels, such that both, a first pixel 4a and a second pixel 4b are electrically connected to the read-out node 6. However, the first pixel 4a and the second pixel 4b are electrically isolated from each other. Therefore, the read-out node may provide photo-generated charge carriers from the first and the second pixel 4a, 4b for read-out. Moreover, the first transfer gate 8a of the first pixel 4a may be configured to enable a read-out of the first pixel 4a using the read-out node 6 and the second transfer gate 8b may disable a read-out of the second pixel 4b during a read-out of the first pixel 4a. Such an arrangement of pixels around a common read-out node 6 allows for designing optical sensor devices having a smaller size, since the area of the semiconductor substrate where read-out nodes are formed is substantially reduced (approximately by the size of the read-out nodes saved). Moreover, the optical sensitive area of the semiconductor substrate where pixels are located, or more precisely where the inbound electromagnetic signal may generate the photo-generated charge carriers contributing to the sensor signal, increases, since the optical inactive area where read-out nodes are located is reduced. In other words, the ratio of the optically active size of a pixel array compared to the actual size of the pixel array (or the semiconductor substrate) is increased. The concept may be applied to CCD (charged coupled device) and/or CMOS (complementary metal oxide semiconductor) time-of-flight sensors using redirection of photo-generated charge carriers or applied to any other suitable design different from CCD.

According to embodiments, the transfer gate may provide the photo-generated charge carriers from a storage region 20 of the first pixel 4a to the read-out node 6 in a read-out mode (of the optical sensor device) and to disable a transfer of the photo-generated charge carriers from the storage region 20 of the first pixel 4a to the read-out node 6 in a sensing mode of the first pixel or, more precisely, if the first pixel is not in the read-out mode. The storage region 20 of the first pixel may be configured to store the photo-generated charge carriers of the first pixel.

Moreover, according to further embodiments, the second transfer gate 8b may provide the photo-generated charge carriers 16a from the storage region 20 of the second pixel (below the storage gate 22b, cf. FIG. 3) to the read-out node 6 in the read-out mode of the second pixel and to disable a transfer of the photo-generated charge carriers from the storage region of the second pixel to the read-out node in a sensing mode of the second pixel or alternatively, if the second pixel is not in the read-out mode. The storage region of the second pixel may store the photo-generated charge carriers of the second pixel 4b.

Figure 2:
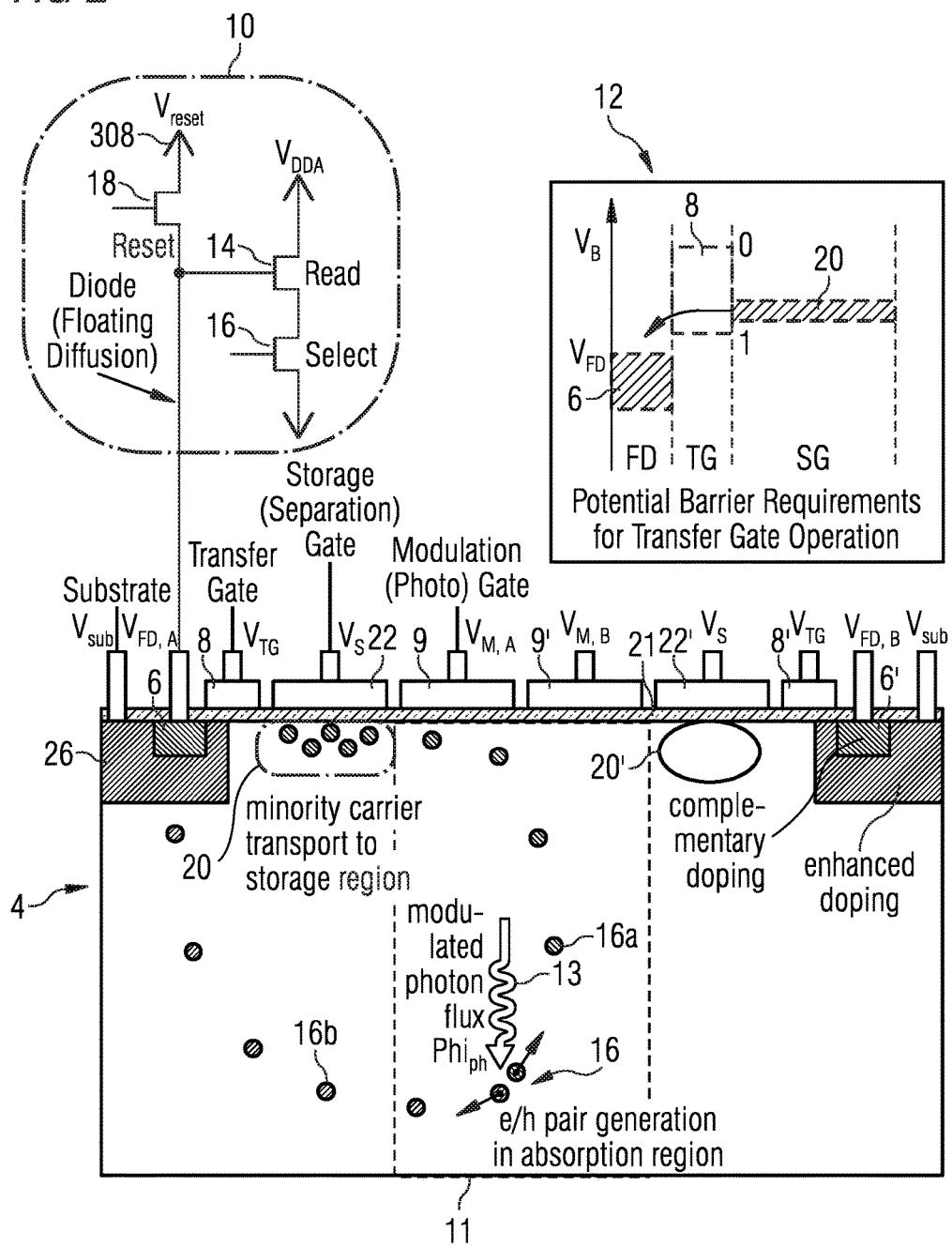
FIG. 2 shows a schematic cross-sectional view of the optical sensor device according to an embodiment.

FIG. 2 shows a schematic cross-sectional view of a pixel 4a in connection with an exemplary read-out circuit 10 and exemplary potential barriers in diagram 12 according to an embodiment. The optical sensor device 2 may comprise, a control electrode 9 to apply a demodulation signal to the time-of-flight sensor to direct e.g. the charge carriers 16a generated by the electromagnetic signal 13 having the first phase to the read-out node 6. In other words, the optical sensor device may comprise for each pixel a first control electrode 9 configured to provide a first electrical field into a conversion region of the optical sensor device such that an electromagnetic signal having a first phase is converted into the photo-generated charge carriers and wherein the first control electrode is configured to provide the generated charge carriers to the storage region. An optical sensor device having only one storage region 20 may be referred to as a one-tap pixel.

In the two-tap pixel approach as shown in FIG. 2, the optical sensor device 2 may further comprise a control electrode 9' to apply a demodulation signal to the time-of-flight sensor to direct e.g. the further charge carriers (not shown) generated by the electromagnetic signal 13 having the second phase to the further storage region 20' and the further read-out node 6'. The electrodes (or modulation gates) 9, 9' may be separated by an isolating material 21 from the conversion region 11. The isolating material 21 may separate the control electrode and the further control electrode from the conversion region 11. Therefore, it may be used a (continuous) layer of the isolating material or, alternatively, different, discontinuous layers. The isolating material may be an interlayer dielectric (ILD) such as an oxide interface. A thickness of the isolating material may be above 1.5 nanometers. In other words, a second control electrode may provide a second electrical field into the conversion region of the optical sensor device such that an electromagnetic signal having a second phase is converted into the photo-generated charge carriers and wherein the second control electrode is configured to provide the generated charge carriers to the further storage region.

In further other words, the optical sensor device may comprise a further read-out node for providing photo-generated charge carriers from a further storage region 20' (below the further storage gate 22') of the first and/or the second pixel 4a, 4b for read-out. Furthermore, the further read-out node 6' may provide photo-generated charge carriers from the storage region 20' of the first and/or the second pixel. Therefore, the storage region may store photo-generated charge carriers derived from an electromagnetic signal having a first phase and/or wherein the further storage region may store photo-generated charge carriers derived from an electromagnetic signal having a second phase.

The conversion region 11 may be preferably defined as the region where electron-hole-pairs may be generated by the electromagnetic signal 13 due to e.g. the internal photoelectric effect. However, the conversion region may be also referred to the area of the semiconductor substrate, where the electromagnetic signal reaches the semiconductor substrate. The electromagnetic signal may generate an electron-hole (e/h) pair in the conversion region (also referred to as absorption region), wherein, for example, minority carriers 16a such as electrons are shifted to the read-out nodes, wherein the other charge carrier, for example a majority carrier 16b such as a hole, may be discharged at a (electric) substrate contact 26. This is advantageous since a saturation of the semiconductor substrate by majority carrier is avoided. However, if electrons form the minority carrier, the semiconductor substrate may be p-doped at a doping concentration preferably equal or smaller than $10^{14}$ atoms/cm$^3$ such as between $10^{12}$ and $10^{14}$ atoms/cm$^3$ or preferably between $5*10^{12}$ and $5*10^{13}$ atoms/cm$^3$ or more preferably between $7.5*10^{12}$ and $2.5*10^{13}$ atoms/cm$^3$. Accordingly, the read-out nodes comprise a complimentary n-doping of a concentration greater than $10^{14}$ atoms/cm$^3$ such as between $10^{14}$ atoms/cm$^3$ and $10^{22}$ atoms/cm$^3$, preferably between $10^{16}$ atoms/cm$^3$ and $10^{21}$ atoms/cm$^3$ or more preferably between $10^{18}$ atoms/cm$^3$ and $5*10^{20}$ atoms/cm$^3$. The substrate contact 26 may comprise an enhanced doping greater than $10^{14}$ atoms/cm$^3$ such as between $10^{14}$ and $10^{20}$, preferably between $10^{16}$ and $10^{19}$ or more preferably between $10^{17}$ and $5*10^{18}$. However, the n- and p-doping orientation may be swapped or interchanged, such that holes are minority carrier and form the electric sensor signal instead of electrons. Embodiments are directed to both doping designs unless anything else is explicitly noted, even though figures may implicitly show only one design and only one design is described with respect to the figures.

In general, the time-of-flight can be measured directly or indirectly. Therefore, it may be distinguished between two different time-of-flight methods. The first method uses light pulses sent out, wherein the turnaround time is measured directly. The second and preferred method uses continuously modulated, for example sinusoidally modulated or amplitude modulated electromagnetic waves such as light waves. A phase delay between the original and the received electromagnetic signal may be exploited for the extraction of the time or distance information. The phase shift is a result of the signal round trip (time) from the measurement system to the scenery and back. It is exploited for the extraction of the distance information. In other words, the signal may be formed by amplitude modulation of the illumination source and demodulation at the same frequency (homodyne detection, lock-in pixel) in the optical sensor. In other words, the optical sensor device, or more specifically the time-of-flight sensor, is configured to conduct a phase sensitive demodulation of the photo-generated charge carriers in the plurality of pixels. The modulation of the inbound electromagnetic signal may be performed by amplitude modulation, in one embodiment by applying a rectangular shaped filter or window such that the electromagnetic signal comprises e.g. a series of rectangular pulses. Accordingly, the demodulation may be performed by applying the same series of rectangular pulses to the modulation gates. Therefore, by shifting the rectangular pulses, the electromagnetic signal having a phase shift of the same amount may be demodulated.

After an integration time where charge carriers are collected in the storage region 20, 20', the integration node voltage may be sensed by a gain stage, such as the exemplary read-out circuit 10, which may comprise a transistor (read) 14 in a source follower topology. The signal may be further analyzed, for example, through a select FET 16 connected to the ADC (analog to digital converter) input stage. Initially, the read-out node may be charged to the reset voltage using the reset switch 18. When using the transfer gates, a further hold switch used to disconnect the optically sensitive node of the sensor (diode) from the gain stage to allow for signal conversion at a later time without impact of the conversion delay on the signal level (global shutter) is absent. Therefore, the main noise source, namely electronic noise from the read-out circuit, is reduced.

Therefore, the integration capacitance is reduced leading to higher signal voltages at a given optical signal and integration time. The capacitance is reduced, since it is formed by the diode in the sensor (n+ region with respect to the substrate, the reset diffusion-to-gate and bulk capacitances, and the source follower input capacitance). Therefore, the capacitance does not rely on a diode in the sensor additionally comprising the n+ region with respect to a separation gate and to a hold switch diffusion to gate and bulk capacitance. Having a reduced integration or conversion capacitance, a faster read-out of the photo-generated charge carriers is enabled since a reduced capacitance has to be loaded before the signal can be derived.

The so-called kTC noise (or thermal noise or Johnson-Nyquist noise) of the hold switch is absent since the hold switch is removed. However, due to a switching of the reset gate kTC noise is still induced. However, this kTC noise can be removed using correlated double sampling (CDS). This is possible, since no hold switch will provide a random voltage noise component at the input of the source follower (sqrt (kT/C)) due to the (dissipative) charge exchange between the capacitance and the integration node through the hold switch MOS-channel resistance. In other words, since there is no separate switch between the gain stage and the read-out node during read-out, the same amount of noise occurs during reset and during read-out, such that the noise impact during reset and during read-out cancels when the two readings are subtracted (cf. FIG. 4A).

Furthermore, area of a separate MOS structure for the hold switch consuming pixel area which cannot be used for the optically active sensor area, thus reducing the signal, is saved.

Thus, a transfer gate 8a, 8a' is integrated into the optical sensor structure separating the floating diode or read-out node 6, 6' from the (charge) storage region 20, 20' under the separation gate or, more precisely, the storage gate 22, 22'. The inset 12 shows the demand towards the potential distribution in the transfer gate region for proper operation. Therefore, the potential of the storage region 20 should be higher than the potential of the read-out node 6, such that if the transfer gate 8a shifts the potential barrier from a degree higher than the potential of the storage region (0) to a state of the potential barrier having a potential between the potential of the storage region 20 and the transfer gate 6 (1) in the read-out node, such that, on the one hand, minority charge carriers are directed to the read-out node, but charge carriers from the read-out node are blocked from moving back to the storage region 20. If the potential barrier during read-out would be below the potential of the read-out node, charge carriers may be collected below the transfer gate and, therefore, not directed to the read-out node 6. The state of the transfer gate may be binary, meaning that two different but known voltages or potentials are applied to enable or to disable the charge carriers to be directed to the read out node. Furthermore, 0 or 1 are not directed to the lower or the higher voltage, respectively. Moreover, depending on the doping and a positive or negative charge of the charge carriers, the higher voltage may be applied for the state 0 wherein the lower voltage may be applied to achieve the state 1.

The reset voltage of the diode (also referred to as floating diffusion or read-out node) is subjected to kTC noise from the reset switch which, however, can be eliminated by correlated double sampling as illustrated in FIG. 4A. The switching action of the transfer gate 8a, 8a' itself does not contribute to kTC noise. Moreover, the transfer may be controlled in such a way that it implements a global shutter action and, thus, replaces the hold switch in conventional read-out circuits (not shown). Moreover, the close integration into the optical sensor saves area, especially when a shared read-out floating diffusion concept is realized which is assumed in this disclosure.

Figure 3:
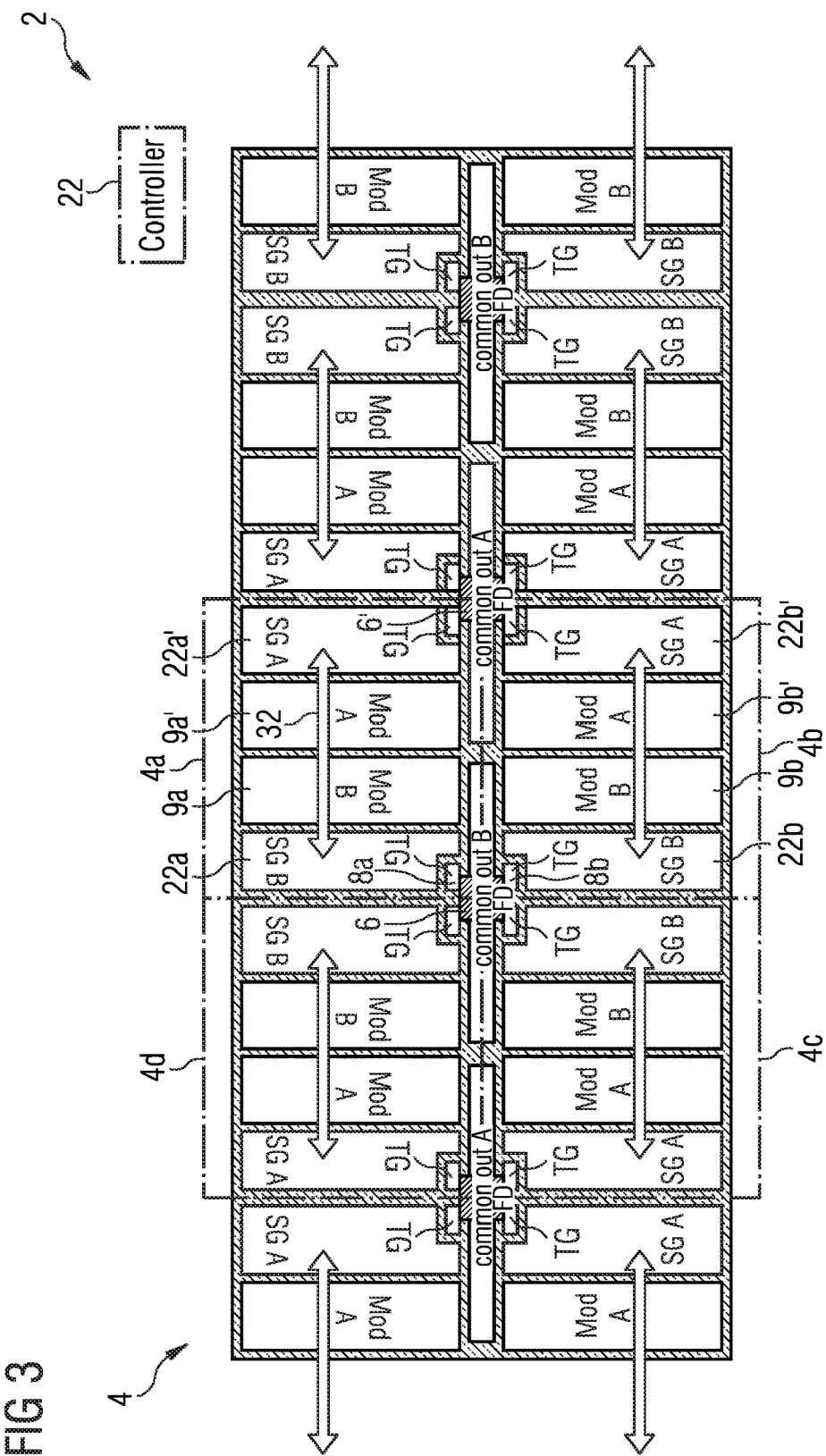
FIG. 3 shows a schematic top view of an exemplary pixel array of the optical sensor device.

Therefore, FIG. 3 shows a schematic top view of the pixel array 4 wherein, exemplarily, four pixels, 4a, 4b, 4c, 4d are connected to the common read-out node 6. Therefore, the area of the semiconductor substrate covered by the read-out node 6 is reduced to one fourth of the size when compared to each pixel having its own read-out node. Furthermore, the further read-out node 6' may provide charge carriers from the first and the second pixel 4a, 4b and two further pixels for read-out, wherein charge carriers provided by the read-out node 6' are generated by the electromagnetic signal having a phase different from the phase used to generate the charge carriers provided at the read-out node 6. Arrows 32 indicate the demodulation direction (or the demodulation region) or, more precisely, the flow of electrons generated by the electromagnetic signal having the two mentioned phases.

Furthermore, the optical sensor device may comprise a controller 22 to control the read-out of the first and the second pixel 4a, 4b through (or using) the read-out node 6. Therefore, the controller 22 may control the first transfer gates 8 such that the first transfer gate 8a obtains a first electric potential in a read-out mode of the first pixel 4a and such that the first transfer gate 8a obtains a second electric potential in a sensing mode of the first pixel 4a, wherein the first electric potential is different from the electric potential (cf. diagram 12 in FIG. 2).

More generally, the controller 22 may control (all) transfer gates of pixels 4 connected to the read-out node 6, 6' such that a transfer of the photo-generated charge carriers to the read-out node 6 is disabled for the connected pixels 4 if the transfer of the photo-generated charge carriers to the read-out node is enabled in one of the pixels connected to the read-out node. In other words, the controller 22 may ensure that only one pixel connected to one read-out node is in a read-out mode, wherein the remaining pixels connected to the read-out node are in a sensing mode or, at least, not in the read-out mode and may be waiting for read-out.

If three or more pixels are connected to one read-out node, the third pixel may comprise a third transfer gate. Therefore, the controller may be configured to disable two transfer gates while one transfer gate is open for read-out of the photo-generated charge carriers and wherein the controller is further configured to disable all transfer gates connected to one read-out node which are in a sensing mode of the pixels and therefore not in the read-out mode.

FIG. 4A shows an exemplary timing diagram indicating an exemplary read-out cycle of two pixels connected to a common read-out node. The two pixels may be part of one image or picture captured by the time of flight sensor. Therefore, the timing diagram may run in or be performed by the controller 22. The x axis reveals the progress in time wherein different relevant signals are shown on the y axis. Starting from the top, line 40 indicates the voltage at the floating diode (or read-out node) 6. The second and third line 42, 44 reveal the voltage at the first transfer gates 8b, 8a, respectively, which may be a binary signal to enable or to disable a flow of the charge carriers from the storage region to the read-out node. Lines 46 and 48 indicate the number of charge carriers below the storage gate 22b (or in the storage region of the second pixel 4b) and the number of charge carriers in the storage region 20a of the first pixel 4a, respectively. Lines 50 and 52 indicate the demodulation voltage applied to the modulation gates, wherein the demodulation voltage 50 is relevant for discussion of the earlier described lines. The second demodulation voltage refers to the demodulated charge carriers generated by the electromagnetic signal having the second phase and therefore affecting the further storage regions 20' and transfer gates 8' of each pixel which are, however, not indicated in this timing diagram. Line 54 indicates the magnitude and phase relation of the electromagnetic radiation reaching the sensor.

On the x axis, different states of the applied voltages are indicated, e.g. the increasing amount of charge carriers in the storage region 20 during demodulation of the inbound electromagnetic signal (cf. lines 46 and 48). Therefore, in a period of time 56, the demodulation voltage is applied to the modulation gates. To ensure that the read-out node has a defined voltage, a reset voltage is applied to the read-out nodes, for example by opening the reset switch 18. Reset may be performed in a period of time 58 and therefore during the whole integration time 56. After the reset switch 18 is opened, the transfer gates indicated by lines 42 and 44 closes at a point in time 60. If the transfer gate is opened during reset, it is ensured that the storage region reveals the same electric potential and that, therefore, only the charge of the charge carriers is used to derive the sensor signal. However, the transfer gates should be closed before the integration time 56 starts since, otherwise, the generated charge carriers would be directly transferred to the read-out node and, therefore, not stored in the storage region. After integration of the charge carriers is finished, the reset switch is closed and read-out of the charge carriers in the storage region is performed. Once the reset switch is closed, a certain degree of noise ($V_{noise1}$) is added to the reset voltage $V_{reset}$ forming the reference value 62 of the voltage of the readout node. The point in time 64 indicated by $t_{s1a}$ indicates a potential sampling point. However, at a point in time 66, transfer of charge carriers of the first storage region to the read-out node starts by opening the transfer gate 8a of the first pixel. After the storage region is discharged, the voltage of the read-out node is dropped to indicate the actual sensor signal. Please note that the dropping of the voltage of the read-out node occurs since minority carriers are assumed to represent the charge carrier. If majority carriers would be used, the voltage may rise. More specifically, the difference between the voltage at the sampling point 68 and the sampling point 64 is the actual sensor signal (without noise due to correlated double sampling).

Furthermore, a further reset is applied to the read-out node in a period of time 70. Again, after the reset switch 18 is closed, at a sampling point 72, the read-out node is preloaded to a voltage comprising the actual reset voltage and a further noise indicated by $V_{noise2}$. At a point in time 74 the transfer gate 8b of the second pixel is opened to perform the read-out of the charge carrier stored in the storage region of the second pixel. After read-out is performed at a point in time 76, the voltage at the read-out node reaches a further level which differs from the level at the point in time 72 by the voltage of the charge carriers of the second pixel. Since, during both measurements, the reset voltage and the voltage of the noise remains (statistically) constant, especially the noise eliminated by subtraction of the voltage of the read-out node before and after read-out of the charge carriers. Therefore, the noise is eliminated which is referred to as correlated double-sampling.

FIG. 4A indicates a timing diagram wherein two pixels connected to a common read-out node perform a synchronized demodulation of the inbound electromagnetic signal and a sequential read-out of the charge carriers stored in the storage region. However, this timing may be improved by the schematic timing indicated in FIG. 4B. In FIG. 4B, it is indicated that the demodulation signal may be applied successively to the modulation gates as well, meaning that the signal 50a applied to the modulation gate 9 of the first pixel is shifted when compared to the signal 50b applied to the modulation gate 9 of the second pixel. Therefore, the cycle of resetting, integration of the charge carriers during sensing of the electromagnetic signal and read-out of the charge carriers in the storage region may be equal for each pixel connected to a read-out node. However, the cycles may be shifted, for example, by one half of the cycle period or at least the period of time needed to read-out the stored charge carriers. Therefore, no delay occurs during sensing of the same pixels when performing two or more consecutive measurements, since each cycle may be performed in the smallest possible period of time. However, using parallel demodulation and successive readout, the cycle period increases by the number of additional read outs to be performed to read out any further pixel connected to the read out node.

FIGS. 5A to 5D show embodiments of the optical sensor device 2 according to embodiments. Compared to the embodiment of FIG. 2, the embodiment of FIG. 5A comprises a buried channel 80 at the surface of the semiconductor substrate where the modulation gates and transfer gates are located. This buried channel implementation allows for a better demodulation efficiency and/or a faster carrier transport between the gates, such as the modulation gate, the storage gate and the transfer gate. The buried channel 80 may be generated by implanting doping atoms of the kind of the doping atoms used to dope the read-out nodes (e.g. n-doped). However, the doping is complementary to the doping of the semiconductor substrate 14. The doping concentration of the buried channels may be smaller than the doping concentration in the read-out node such as between $10^{12}$ and $10^{18}$ atoms/cm$^3$ or preferably between $10^{14}$ and $10^{17}$ atoms/cm$^3$ or more preferably between $10^{15}$ and $10^{16}$ atoms/cm$^3$. Using the buried channels, the charge carriers generated by the electromagnetic signal may be guided through the buried channel to the read-out node. Therefore, less charge carriers reach the main surface area of the semiconductor substrate 14, where it would be more likely that the charge carriers recombine or get trapped before they are read-out by the read-out node. Thus, using the buried channel, more charge carriers may reach the read-out node. In other words, the optical sensor device comprises a buried channel 36 in the semiconductor substrate between the conversion region 12 and the read-out node 6 to obtain an increased read-out efficiency of the optical sensor device 2.

FIG. 5B shows an embodiment wherein, compared to FIG. 5A, an additional modulation gate 82 is formed adjacent or between to the earlier described modulation gates (or control electrodes) 9, 9'. Using the further modulation gate 82, the depth of the space charge region may be increased. Therefore, the amount of the (comparably fast, when compared e.g. to a diffusive charge carrier transport) charge carrier drift transport in the space charge region is increased. Conversely, comparatively slow diffusive charge carrier transport may occur below the control electrodes 9, 9', 82, wherein below the gaps between the control electrodes, the fringing field transport occurs. In other words, the diffusive charge carrier transport is slower than the fringing field transport and by increasing the number of control electrodes, the amount of the diffusive charge carrier transport decreases when compared to the fringing field transport.

Moreover, FIG. 5B shows the further control electrode 9' generated by a dual poly process. Using the dual poly process, the further control electrode 9' may be formed by a polysilicon, e.g. the same material as used to form the storage gate 22' or the control electrode 9. Furthermore, the further control electrode, or the material used to form the further control electrode, may overlap the storage gate 22' and optionally the transfer gate 8'. Between the further storage gate and/or the transfer gate may be arranged a dielectric, e.g. the same material as used for the isolating material 21. This may increase the demodulation efficiency at the modulation gates and/or the transfer performance at the transfer gate, since the gaps between the further control electrode, the storage gate and the transfer gate is closed. Therefore, electrical fields or charge carriers such as e.g. ions affecting the gaps e.g. induced by BEOL (back-end-of-line) structures, or in general by the environment, are shielded or protected and may therefore not reach the semiconductor substrate where these electrical fields or charge carriers may move or relocate charge carriers or electrical fields or the space charge region in the semiconductor substrate. Furthermore, e.g. the isolating layer 21 may catch free ions and may therefore reduce its isolating property.

FIG. 5C shows, compared to FIG. 5A, an enhanced storage well doping in a region 84 at least in a part of the storage region 20, 20' and/or below the transfer gates 8, 8'. The enhanced well doping allows for capturing the photogenerated charge carriers below the storage region. A further effect is that the potential difference between the read-out node and the enhanced storage well doping region is reduced, wherein the potential barrier below the transfer gate becomes higher for the collected photo-generated charge carriers. Therefore, the chance or likelihood of an accidental movement of charge carriers through the potential barrier is reduced. In other words, the storage well implant in the region 84 increases a full well capacitance and/or allows for a higher dynamic range. The higher dynamic range may refer to the sensor being able to process a greater amount of light, meaning that a saturation point is reached later when compared to an arrangement without the storage well implant. This allows for obtaining a good measurement signal even in a bright environment or if a great amount of light from the modulation source shall be measured. In other words, an object to be measured may be highly reflecting or in a short distance to the optical sensor device, such that a great amount of reflected light from the object is inbound into the optical sensor device.

FIG. 5D shows, compared to FIG. 5C, an additional storage well barrier doping in a region 86 to redirect minority carriers to the demodulation region. Using the storage well barrier doping improves or enhances the presence or the number of minority carriers next to the demodulation region, such that they are not attracted to a storage node before demodulation has taken place which would reduce the demodulation efficiency. In other words, the barrier doping below the storage well may redirect minority carriers from the substrate to the demodulation region for better demodulation efficiency (or other means of substrate doping modulation for minority carrier redirection).

FIG. 6 shows a schematic block diagram of a method 600 for operating a time-of-flight sensor. The method 600 comprising a step 602 of controlling a first transfer gate of a first pixel and controlling a second transfer gate of a second pixel such that a transfer of photo-generated charge carriers from a first pixel to a read-out node is disabled if a transfer of photo-generated charge carriers from the second pixel to the read-out node is enabled and/or such that a transfer of photo-generated charge carriers from the second pixel to the read-out node is disabled if a transfer of photo-generated charge carriers from the first pixel to the read-out node is enabled.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. An optical sensor device, comprising:
a pixel array having at least three pixels;
a first read-out node configured to provide first photo-generated charge carriers from the at least three pixels for read-out;
a second read-out node configured to provide second photo-generated charge carriers successively from one or more of the at least three pixels for read-out;
a first transfer gate configured to enable a read-out of a first pixel, of the at least three pixels, using the first read-out node;
a second transfer gate configured to disable a read-out of a second pixel, of the at least three pixels, via the first read-out node during the read-out of the first pixel;
a third transfer gate configured to disable a read-out of a third pixel, of the at least three pixels, via the first read-out node during the read-out of the first pixel; and
a controller configured to control the first transfer gate, the second transfer gate, and the third transfer gate to perform a successive read-out of the at least three pixels,
the optical sensor device being a time-of-flight sensor, and
each remaining pixel, of the at least three pixels, being disabled for read-out via the first read-out node when one of the at least three pixels is enabled for read-out via the first read-out node.

2. The optical sensor device of claim 1, wherein the optical sensor device is further configured to:
conduct a phase sensitive demodulation of the first photo-generated charge carriers.

3. The optical sensor device of claim 1, wherein the first transfer gate is further configured to:
provide the first photo-generated charge carriers from a storage region of the first pixel to the first read-out node based on the first pixel being in a read-out mode; and
disable a transfer of the first photo-generated charge carriers from the storage region of the first pixel to the first read-out node based on the first pixel being in a sensing mode,
the storage region of the first pixel being configured to store the first photo-generated charge carriers of the first pixel.

4. The optical sensor device of claim 1, wherein the second transfer gate is further configured to:
provide the first photo-generated charge carriers from a storage region of the second pixel to the first read-out node based on the second pixel being in a read-out mode; and
disable a transfer of the first photo-generated charge carriers from the storage region of the second pixel to the first read-out node based on the second pixel being in a sensing mode,
the storage region of the second pixel being configured to store the first photo-generated charge carriers of the second pixel.

5. The optical sensor device of claim 1, wherein the first read-out node is further configured to:
provide the first photo-generated charge carriers from a first storage region of the first pixel; and
provide the first photo-generated charge carriers from a second storage region of the first pixel,
the second storage region being configured to store the first photo-generated charge carriers derived from an electromagnetic signal having a first phase, and
the first storage region being configured to store the first photo-generated charge carriers derived from the electromagnetic signal having a second phase.

6. The optical sensor device of claim 1, wherein the one of the at least three pixels further comprises:
a control electrode configured to:
provide an electrical field into a conversion region of the optical sensor device such that an electromagnetic signal having a particular phase is converted into the first photo-generated charge carriers, and
provide the first photo-generated charge carriers to a storage region.

7. The optical sensor device of claim 6, wherein the control electrode is a first control electrode;
wherein the electrical field is a first electrical field;
wherein the particular phase is a first phase;

wherein the storage region is a first storage region; and
wherein the one of the at least three pixels further comprises:
a second control electrode configured to:
provide a second electrical field into a conversion region of the optical sensor device such that an electromagnetic signal having a second phase is converted into the second photo-generated charge carriers, and
provide the second photo-generated charge carriers to a second storage region.

8. The optical sensor device of claim 1, wherein the controller is further configured to:
control a read-out of the one or more of the at least three pixels through the second read-out node.

9. The optical sensor device of claim 1, wherein the controller is further configured to:
control the first transfer gate such that the first transfer gate obtains a first electric potential based on the first pixel being in a read-out mode, and
control the first transfer gate such that the first transfer gate obtains a second electric potential based on the first pixel being in a sensing mode,
the first electric potential being different from the second electric potential.

10. The optical sensor device of claim 1, wherein the controller is further configured to:
control transfer gates of the at least three pixels such that a transfer of the first photo-generated charge carriers to the first read-out node is disabled for each remaining pixel, of the at least three pixels, based on the transfer of the first photo-generated charge carriers to the first read-out node being enabled for the one of the at least three pixels.

11. The optical sensor device of claim 1, wherein each of the at least three pixels include transfer gates.

12. The optical sensor device of claim 1, further comprising:
a control electrode arranged at least partly covering a storage gate.

13. The optical sensor device of claim 1, wherein each remaining pixel, of the at least three pixels, are in a sensing mode when the one of the at least three pixels is enabled for read-out.

14. The optical sensor device of claim 1, wherein the first transfer gate is further configured to:
provide the second photo-generated charge carriers from a storage region of the first pixel to the second read-out node based on the first pixel being in a read-out mode; and
disable a transfer of the second photo-generated charge carriers from the storage region of the first pixel to the second read-out node based on the first pixel being in a sensing mode,
the storage region of the first pixel being configured to store the second photo-generated charge carriers of the first pixel.

15. A method for operating a time-of-flight sensor, comprising:
providing, by a device via a first read-out node, first photo-generated charge carriers from a plurality of pixels for read-out,
the plurality of pixels including at least three pixels;
providing, by the device via a second read-out node, second photo-generated charge carriers successively from one or more of the plurality of pixels for read-out;

enabling, by a first transfer gate of the device, a read-out of a first pixel, of the plurality of pixels, using the first read-out node;
disabling, by a second transfer gate of the device, a read-out of a second pixel, of the plurality of pixels, via the first read-out node during the read-out of the first pixel;
disabling, by a third transfer gate of the device, a read-out of a third pixel, of the plurality of pixels, via the first read-out node during the read-out of the first pixel; and
controlling, by the device, the first transfer gate, the second transfer gate, and the third transfer gate to perform a successive read-out of the plurality of pixels,
each remaining pixel, of the plurality of pixels, being disabled for read-out via the first read-out node when one of the plurality of pixels is enabled for read-out via the first read-out node.

16. The method of claim 15, further comprising:
conducting a phase sensitive demodulation of the first photo-generated charge carriers.

17. The method of claim 15, further comprising:
providing the first photo-generated charge carriers from a storage region of the first pixel to the first read-out node based on the first pixel being in a read-out mode; and
disabling a transfer of the first photo-generated charge carriers from the storage region of the first pixel to the first read-out node based on the first pixel being in a sensing mode,
the storage region of the first pixel being configured to store the first photo-generated charge carriers of the first pixel.

18. The method of claim 15, further comprising:
providing the second photo-generated charge carriers from a storage region of the second pixel to the second read-out node based on the second pixel being in a read-out mode; and
disabling a transfer of the second photo-generated charge carriers from the storage region of the second pixel to the second read-out node based on the second pixel being in a sensing mode,
the storage region of the second pixel being configured to store the second photo-generated charge carriers of the second pixel.

19. The method of claim 15, further comprising:
providing an electrical field into a conversion region of the device such that an electromagnetic signal having a particular phase is converted into the first photo-generated charge carriers, and
providing the first photo-generated charge carriers to a storage region.

20. An optical sensor device, comprising:
a pixel array having at least three pixels;
a first read-out node configured to provide first photo-generated charge carriers from the at least three pixels for read-out;
a second read-out node configured to provide second photo-generated charge carriers from the at least three pixels for read-out,
the second photo-generated charge carriers being different from first the photo-generated charge carriers,
each pixel, of the at least three pixels, comprising a first transfer gate configured to provide the first photo-generated charge carriers from a first storage region of each of the at least three pixels to the first read-out node,
each pixel, of the at least three pixels, comprising a second transfer gate configured to provide the second photo-generated charge carriers from a second storage region of each of the at least three pixels to the second read-out node, the first storage region being configured to store the first photo-generated charge carriers derived from an electromagnetic signal having a first phase, and the second storage region being configured to store the second photo-generated charge carriers derived from the electromagnetic signal having a second phase; and a controller configured to control transfer gates of the at least three pixels connected to the first read-out node such that when one of the at least three pixels connected to the first read-out node is enabled for read-out, remaining pixels, of the at least three pixels, connected to the first read-out node are disabled for read-out to perform a successive read-out of the at least three pixels connected to the first read-out node.

* * * * *